United States Patent

Swanberg

[11] Patent Number: 4,814,636
[45] Date of Patent: Mar. 21, 1989

[54] FULL PIXEL PULSE STRETCHING FOR PHASE REVERSAL SCOPHONY TRANSMISSION

[75] Inventor: Melvin E. Swanberg, Claremont, Calif.

[73] Assignee: Xerox Corporation, Stamford, Conn.

[21] Appl. No.: 130,586

[22] Filed: Dec. 9, 1987

[51] Int. Cl.$^4$ .......................... H03K 5/04; H04N 5/76
[52] U.S. Cl. ...................................... 307/865; 328/58; 358/296
[58] Field of Search .............................. 328/58, 16, 23; 307/261, 265, 266, 267, 268, 262; 358/296, 300, 302; 364/607, 608

[56] References Cited

U.S. PATENT DOCUMENTS

| | | | |
|---|---|---|---|
| 3,278,898 | 10/1966 | Rumble | 307/267 |
| 3,424,989 | 1/1969 | Ezath et al. | 307/266 |
| 4,213,158 | 7/1980 | DeBenedictis | 358/296 |
| 4,253,725 | 3/1981 | Johnson | 358/199 |
| 4,357,627 | 11/1982 | Johnson | 358/296 |
| 4,397,042 | 8/1983 | Tsujii et al. | 364/608 |
| 4,639,073 | 1/1987 | Yup et al. | 358/296 |

FOREIGN PATENT DOCUMENTS 0044326 3/1982 Japan ................................ 307/261
0044327 3/1982 Japan ................................ 307/261

OTHER PUBLICATIONS

Johnson et al., "Scophony Spatial Light Modulator", Optical Engineering—vol. 24, No. 1—Jan./Feb. 1985—pp. 93-100.

Primary Examiner—John S. Heyman
Assistant Examiner—Tai V. Duong
Attorney, Agent, or Firm—Robert E. Cumha

[57] ABSTRACT

In a phase reversed bit stream, to increase the power in the fundamental frequency and reduce harmonics, each group of positive and negative ON bits is stretched by one pulse width. A stretch of slightly less than one pulse width may also be used to prevent glitches. This invention is useful in an optical raster output scanner where a greater amount of power in the fundamental frequency will result in a grater image intensity for the same data rate.

4 Claims, 6 Drawing Sheets

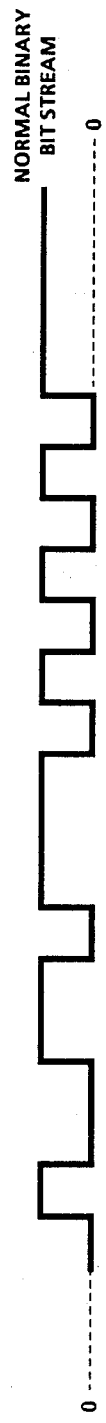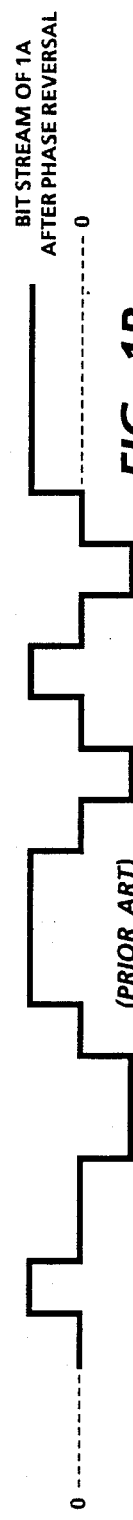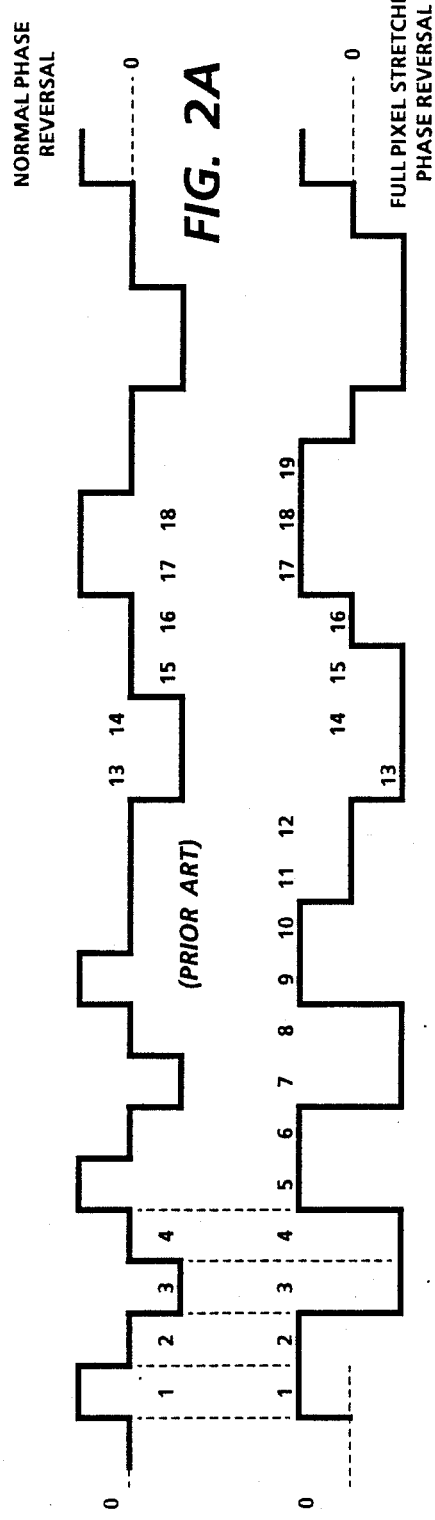

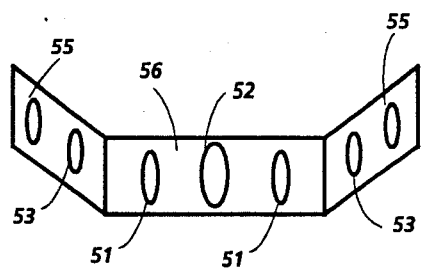
FIG. 5
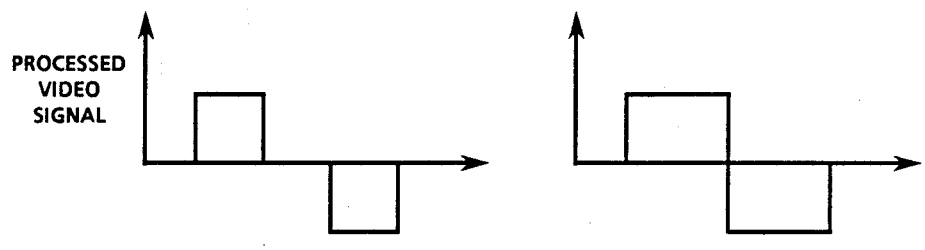
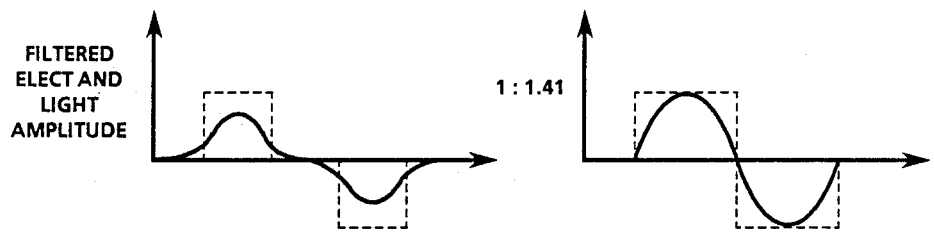
FIG. 6A     FIG. 6B

FULL PIXEL PULSE STRETCHING FOR PHASE REVERSAL SCOPHONY TRANSMISSION

BACKGROUND OF THE INVENTION

This is a method and circuit for stretching each group of phase reversed binary bits in a series by one full bit to improve the transmission characteristics by lowering the harmonic content while increasing the signal content.

In scanning imaging systems, one method of achieving improved resolution performance is through the use of a technique called "Scophony Imaging". This technique is described in an Optical Engineering article, 24(1). 093–100 (Jan/Feb 1985), Scophony Spatial Light Modulator, by Richard Johnson, JeanMichael Guerin and Melvin E. Swanberg. In such image scanning systems each image element or "pixel" is represented by a binary bit. In a normal series of binary bits, one clock period is assigned to each succesive bit. For example, an ON bit is indicated by a positive voltage and an OFF bit is indicated by zero volts. A group of bits is a connected series of bits of the same state. Then, for example, in a bit stream where a group of two ON bits is followed by a group of two OFF bits, there will be two clock periods where the output voltage will be high, followed by two clock periods where the output voltage will be zero.

Application of phase reversal to Optical scanners is also described in the article referenced above. FIG. 13 and accompanying text shows phase reversal being used in optical image formation. This means that for each successive group, the ON voltage will first be positive and then negative. Thus, for example, for three successive groups of ON bits, the first will be represented by a positive voltage, the second by a negative voltage and the third represented by a positive voltage. The OFF bits will always be zero volts.

The highest primary signal frequency that can be represented by a bit stream is where single ON and OFF bits alternate. Using the system of phase reversal results in a reduction of the primary signal by a factor of two, but the waveform contains a high content of odd harmonics. For the same data rate, it is desirable to increase the amplitude of the information portion of the signal, and to decrease the harmonics of this signal.

SUMMARY OF THE INVENTION

To increase the power is the fundamental frequency and to reduce harmonics, for the same data rate, each group of ON bits can be extended by one bit. Thus alternating ON and OFF bits becomes a series of two positive clock periods followed by two negative clock periods. Groups containing two ON bits become groups of three, groups of three become groups of four, etc.

The result of this transformation is the reduction of the harmonic content and increase of the signal component. For example, in a series of groups originally having two bits each, the resultant three bit groups will yield about a 30% increase in the fundamental component, and about a 50% decrease in the third and fifth harmonic components, than the original bit stream would have contained. Thus, by using full-bit stretching, the frequencies of interest are enhanced, while the higher harmonics are supressed. This invention is useful in an optical raster output scanner where a greater amount of power in the fundamental frequency and less in the higher harmonics will result in greater image intensity for the same data rate.

BRIEF DESCRIPTION OF THE DRAWINGS

FIG. 1a is a timing diagram of a line of typical binary bits.

FIG. 1b is a timing diagram showing of line of FIG. 1a converted to a line of phase reversed bits.

FIG. 2a is a timing diagram of a line of typical phase reversed bits.

FIG. 2b is a timing diagram of a conversion of the line of FIG. 2a to a full pixel stretched line of bits.

FIG. 5 is a diagram of a polygon showing the points that light generated by various harmonics will strike the polygon with respect to the current facet.

FIG. 6a shows the filtered electrical signal and light amplitude as a product of a prior art phase reversed signal.

FIG. 6b shows the filtered electrical signal and light amplitude as a product of a stretched and phase reversed signal.

DETAILED DESCRIPTION OF THE INVENTION

Figure 3A:
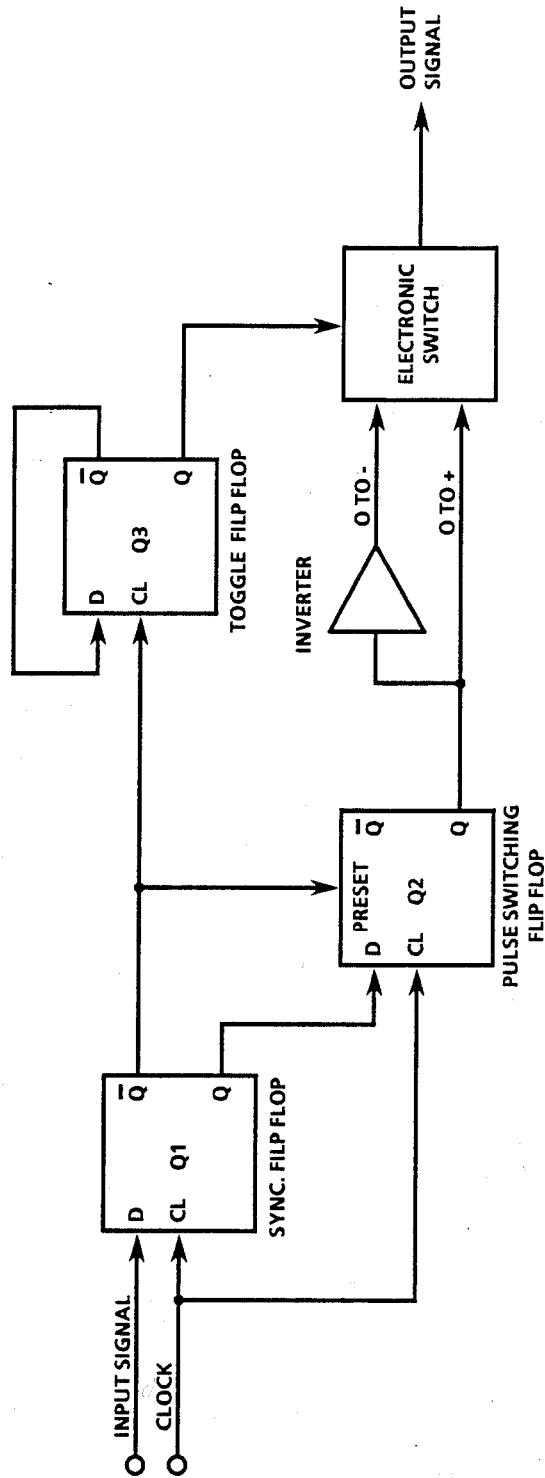
FIG. 3a is a simplified schematic diagram of a circuit to produce pulse stretching and phase reversal.

FIG. 1a is a diagram of a prior art binary bit stream where the first group comprises one bit, the second group comprises two bits and the third group comprises three bits, all separated by one or two zero OFF bits.

The fundamental frequency can be reduced by using phase reversal, as shown in FIG. 1b. Here the first one-bit group is positive, the second two-bit group is negative, the third three-bit group is positive again, and all groups are separated by at least one zero level OFF bit.

FIG. 2a is a timing diagram of normal phase reversal and FIG. 2b shows each group stretched by a full bit. During the first clock period there was originally a one bit positive ON signal. This has been stretched by one full bit and appears as a two bit positive ON signal covering clock periods 1 and 2 in FIG. 2b. Similarly the negative ON signal at clock period 3 of FIG. 2a has been stretched to a two bit negative signal at FIG. 2b covering clock periods 3 and 4.

The groups having a plurality of bits are also stretched by one full bit. Thus the two negative bits at clock periods 13 and 14 of FIG. 2a are stretched to three negative bits at clock periods 13, 14 and 15 of FIG. 2b, and the two positive bits at clock periods 17 and 18 of FIG. 2a are stretched to three positive bits at clock periods 17, 18 and 19 of FIG. 2b.

FIG. 3a is a simplified diagram of one method to accomplish the pulse stretching and phase reversal functions. The three flip flops are of the "D" type, wherein the Q outputs reflect the D input at the negative transition of the clock input. The flip flop Q1 is used to restore the shape and synchronization of the incoming signal, and to provide a complementary signal for the pulse stretching and phase reversal circuits. The flip flop Q2 provides the pulse stretching function, and the Q3 flip flop provides the switching command for the phase reversal function.

The appearance of the incoming signal to the circuit of FIG. 3a is as shown in FIG. 1a. The clock signal, in conjunction with Q1, provides signals that have been phase synchronized with the clock, and have the same bit pattern as the input signal and its complement. The pulse stretching is accomplished by Q2, as it responds immediately to the high to low transition at the Preset input, but not to the low to high transitions at the D input. The signal at the D input of Q2 must remain low for two clock periods in order for this transition of Q1 to be effected.

The complementary signal for Q1 not only presets Q2 but also toggles Q3, both events occuring at the low transition of this signal which corresponds to the low to high transition of the input signal. The output of Q2 is applied to one input of an electronic switch, and is also inverted and applied to the other input of the switch. The toggle flip flop Q3 then switches the output between the two inputs each time three is a positive transition of the input signal. The resultant output signal then has the apearance of the waveform shown in FIG. 2b.

Figures 1, 3B:
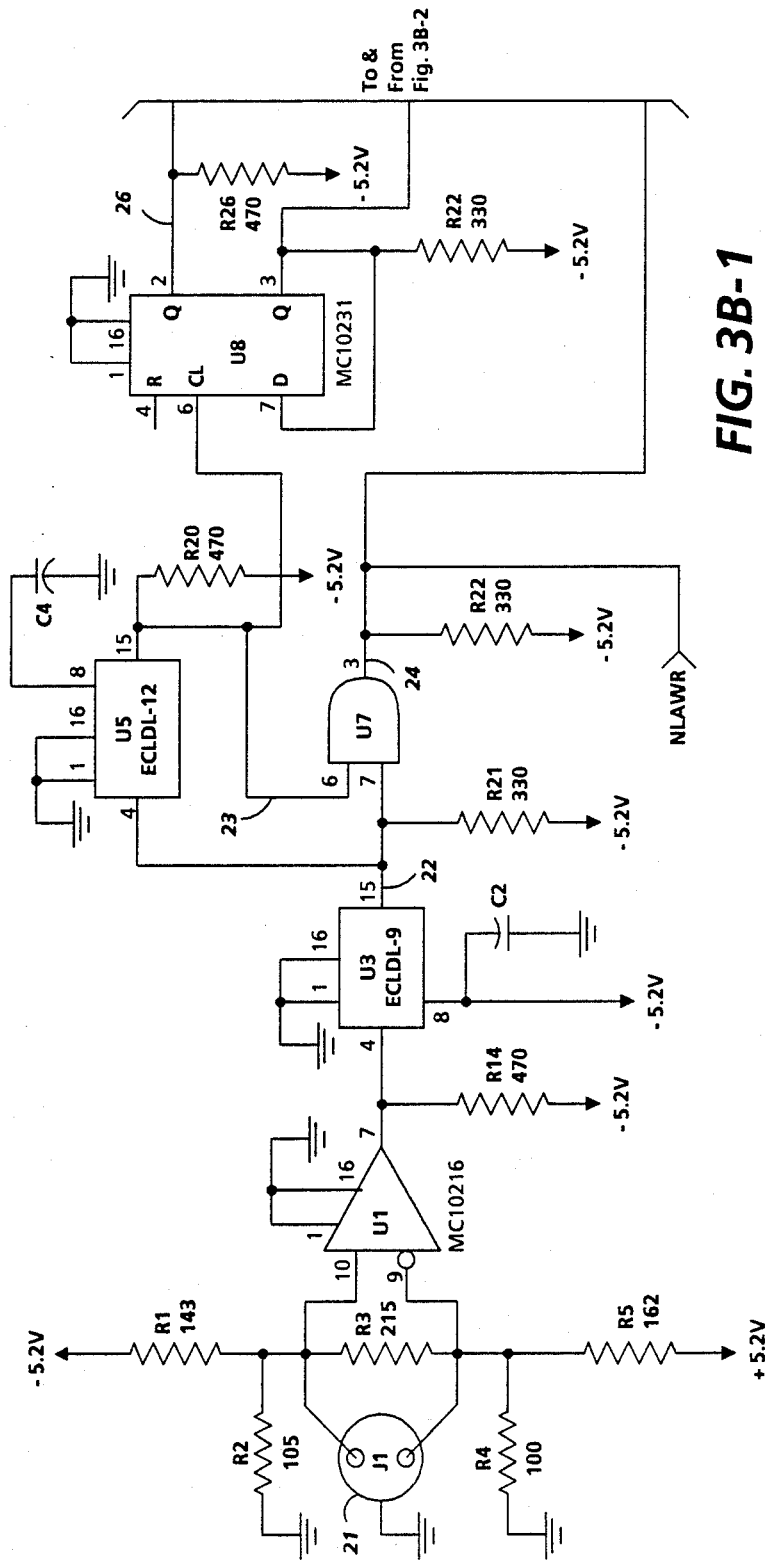
FIG. 3b1 and 3b2 is a schematic diagram of the circuit for producing the pulse stretching.
Figures 2, 3B:
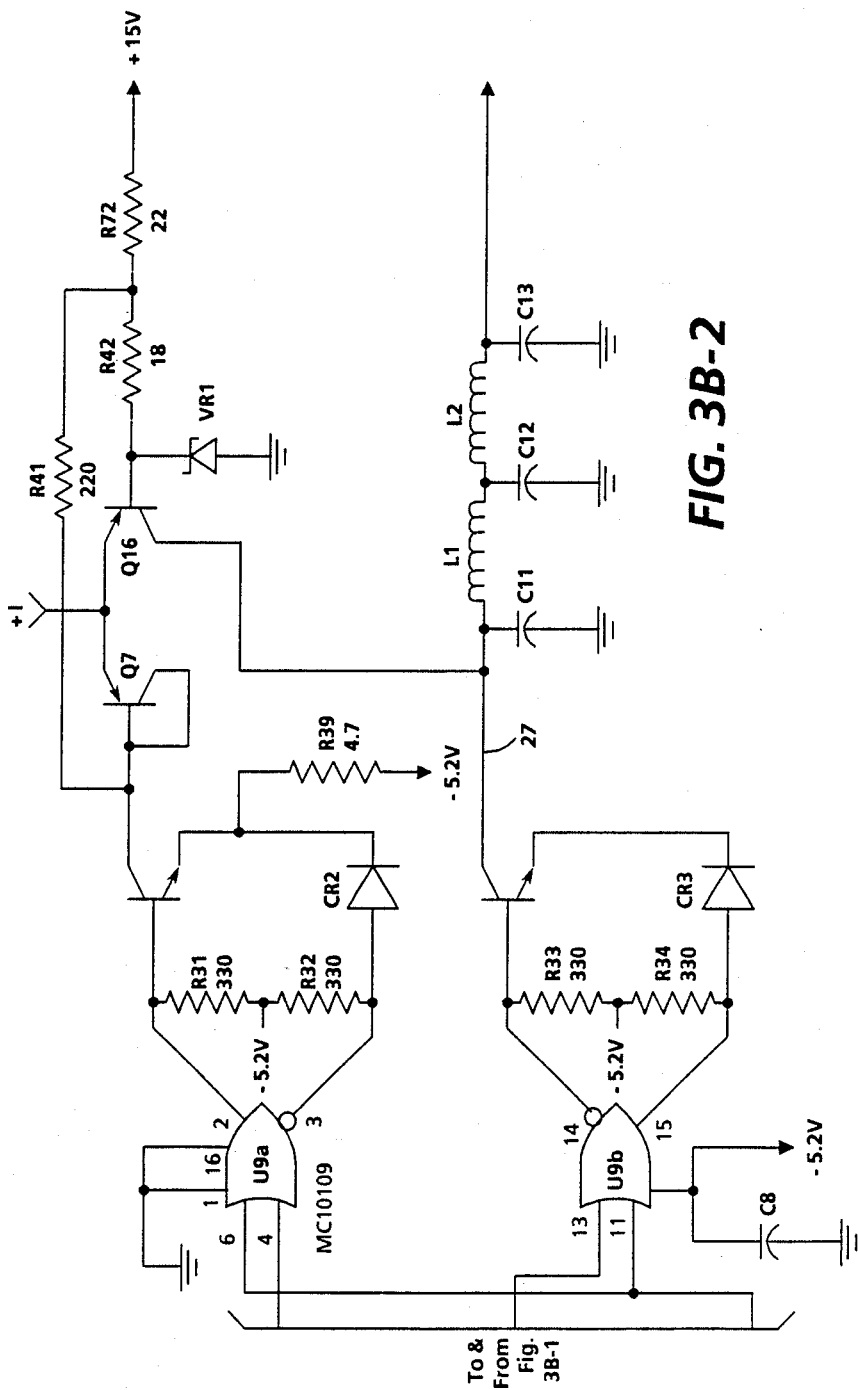

FIG. 3b1 and 3b2 is a detailed schematic diagram of a circuit for accomplishing this full bit stretching function and phase reversal. The normal binary input is applied to J1 at line 21, the waveshape on that line being shown in FIG. 4 as waveshape number 21. This is a typical binary pulse train with ON pulses at a positive voltage and OFF pulses at zero volts. These are applied to an amplifier/inverter U1 to more clearly define the leading and trailing edges of the signal and are then applied to fixed delay U3. This signal has to be aligned in its timing with other circuits in the system. By providing a fixed timing at this point, and variable timing at the other circuits, the system timing can be synchronized.

Figure 4:
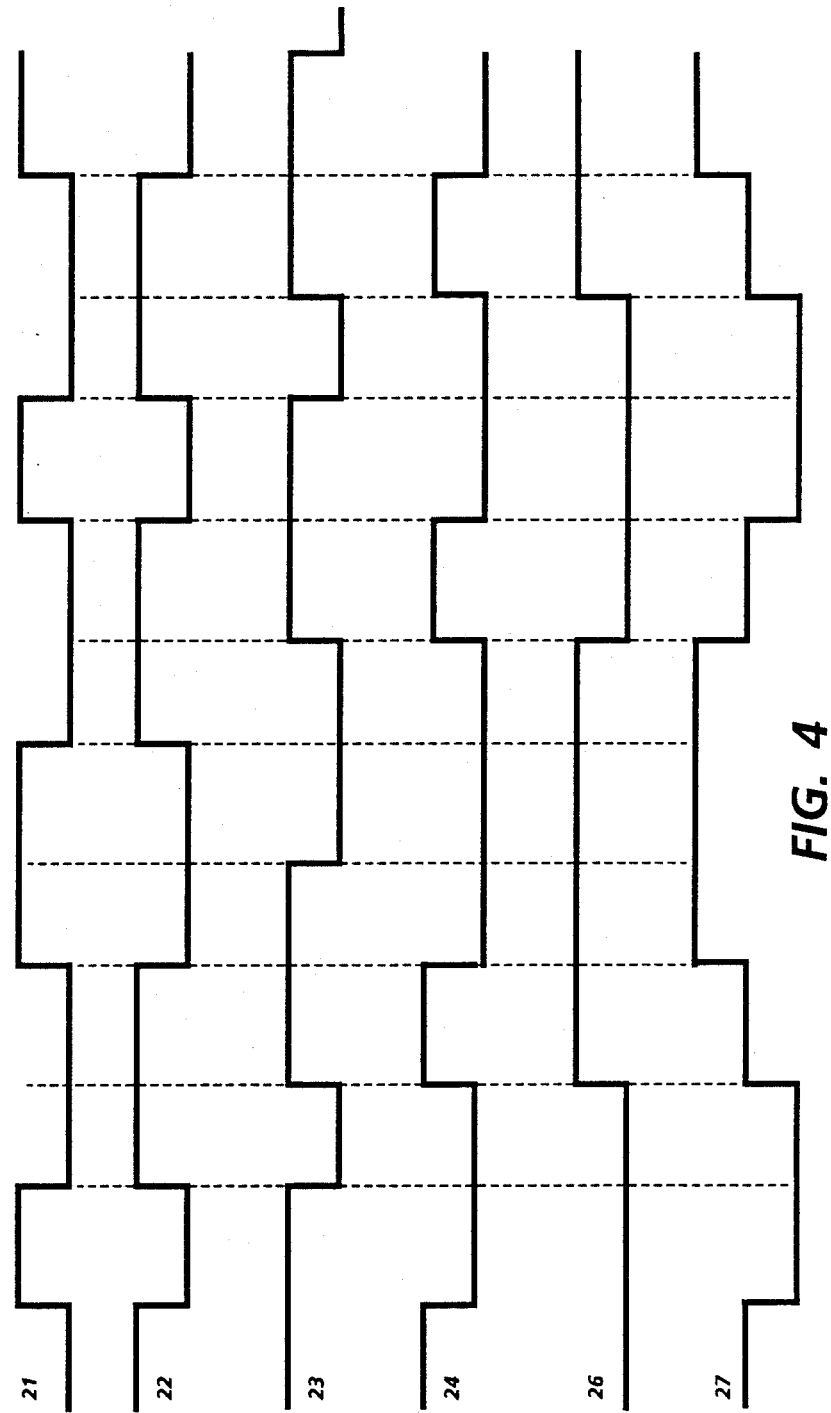
FIG. 4 is a timing diagram of the waveshapes of the circuit of FIG. 3.

Next, the signal goes simultaneously to an OR gat U7, and another delay line U5. The waveshape at pin 7 and U7 is shown as waveshape 22 of FIG. 4, a negative going binary bit stream. The waveshape at pin 6 of U7 is shown as waveshape 23, a negative going binary bit stream delayed by one clock period. These are ORed at U7 to produce a bit stream at pin 3 of U7 where every group is stretched by one pulse, as shown in FIG. 4 waveshape 24. One bit is stretched to two bits, two are stretched to three, etc.

The amount of delay of delay line U5 is the amount of time that will be added to each group of bits, and has been described throughout this description as a full pulse width. However, there is no reason why it has to be exactly one full bit, and, in fact, in this described embodiment, it is less. The basic clock period is fifteen nanoseconds in this described embodiment but the delay is twelve. That is to make sure that there are no glitches in the system even when imperfect circuit components may be used.

At the same time the output of U5 is applied to flip-flop U8, the outputs of which switch at each incoming positive going edge. At all times this edge corresponds in time to the end of the stretched group. The complementery outputs of U8 are applied to one input of each of two OR gates U9a and U9b. The other input to each gate is the stretched output of U7. Under control of flip flop U8, one or the other of the set two OR gates will conduct, either U9a putting out a positive going waveshape at pin 2 or U9b putting out a negative going waveshape at pin 14. These signals are amplified respectively at transistors Q3 and Q4. A constant negative current is applied to the emitter of transistor Q4. When Q4 is turned on, that negative current is felt at point 27. Similarly there is a positive constant current applied to the emitter of Q7. When Q3 is turned on the positive current is felt through transistor Q16 to the same point 27. Therefore the signals are mixed at point 27, the waveshape of which is shown in FIG. 4 as waveshape 27. This is the final output showing a bit stream that is stretched and pulse reversed. Finally, filter elements C11, C12, C13, L1 and L2 filter out the spurious frequencies to produce a clean output waveshape.

In an optical raster output scanner comprising a rotating polygon, the binary bit stream is used to modulate the optical beam, as described in the above cited article. When the beam is modulated by the phase reversal signal, the beam pattern at the polygon appears as shown in FIG. 5. The unmodulated main beam 52 is split into two sidebeams 51, that correspond to the fundamental frequency sidebands of the modulating signal. In addition, sidebeams that correspond to harmonics of this signal are also generated, four such sidebeams 53, 55 from the third and fifth harmonics being shown. These harmonic sidebeams will fall outside the current facet and represent lost illuminating energy. It is for this reason that it is important in an optical system that these higher frequencies be filtered out of the applied video signal so that a maximum of the applied beam falls on the current facet.

If the binary bit stream is simply electrically filtered to remove the harmonics, then the amplitude of the signal would suffer as well, and there would be essentially no difference between losing optical energy by spatial filtering (loss of sidebands at the facet) or loss of electrical amplitude by electrical filtering, as the lower electrical signal would produce less diffracted energy into the fundamental bands in either case.

However, if the video pulses are stretched as described, then the amplitude of the fundamental frequency component of the waveform will have been increased 1.41 times. This is shown in FIGS. 6a and 6b which show the processed video signals, and the resultant electrical or optical amplitude, for normal video and stretched video, respectfully. It should be noted that light intensity is the square of the light amplitude, and thus a difference of 1.41 in light amplitude yields a two-to-one increase in intensity. Thus the intensity of the image of a video signal of maximum pulse rate, that is one ON and one OFF, can be doubled by this pulse stretching technique. This is understandable since the ON time of each pulse is also doubled.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

I claim:

1. The method of generating a waveshape representing a series of binary bits comprising the steps of:
   separating said bits into group of ON bits, a group being defined as one or a continuous plurality of bits of the same state, preceeded and followed by at least one OFF bit,
   assigning a voltage of zero volts for the duration of a clock period to each OFF bit,
   alternately assigning positive and negative voltages to each group of ON bits, the number of click periods in each group being equal to the number of ON bits in that group, and extending each group of ON bits by an additional clock period at the same voltage as the other bits of that same group, and reducing the number of OFF bits following each group by one bit.

2. The method of generating a waveshape representing a series of binary bits comprising the steps of:

separating said bits into group of ON bits, a group being defined as one or a continuous plurality of bits of the same state, preceeded and followed by at least one OFF bit, assigning a voltage of zero volts for the duration of a clock period to each OFF bit, alternately assigning positive and negative voltages to each group of ON bits, the number of clock periods in each group being equal to the number of ON bits in that group, and extending each group of ON bits by an additional time period, said time period being less than one clock period, at the same voltage as the other bits of that same group, and reducing the time of the next OFF bit by the same time period.

3. The method of generating a waveshape representing a series of binary bits comprising the steps of:

separating said bits into group of ON bits, each group being defined as one or a continuous plurality of ON bits, preceeded and followed by at least one OFF bit, assigning a voltage of zero volts for the duration of a clock period to each OFF bit, extending each group of ON bits by an additional clock period, reducing each group of OFF bits by one clock period, and alternately assigning a positive or negative voltage to each group of ON bits.

4. The method of generating a waveshape representing a series of binary bits comprising the steps of:

separating said bits into group of ON bits, each group being defined as one or a continuous plurality of bits of the same state, followed by at least one OFF bit, extending each group of ON bits by an additional time period, said time period being less than one clock period, which will shorten the following OFF bit, assigning a voltage of zero volts to each OFF bit and partial OFF bit, and alternately assigning positive and negative voltages to each group of ON bits and partial ON bits.

* * * * *